(12) United States Patent
Xie et al.

(10) Patent No.: US 10,743,405 B2
(45) Date of Patent: Aug. 11, 2020

(54) PRINTED CIRCUIT BOARD AND DISPLAY APPARATUS

(71) Applicants: HEFEI XINSHENG OPTOELECTRONICS TECHNOLOGY CO., LTD., Hefei, Anhui (CN); BOE TECHNOLOGY GROUP CO., LTD., Beijing (CN)

(72) Inventors: Enming Xie, Beijing (CN); Xiaolong Wei, Beijing (CN); Chun Cao, Beijing (CN); Wenchao Bao, Beijing (CN)

(73) Assignees: HEFEI XINSHENG OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/456,332

(22) Filed: Jun. 28, 2019

(65) Prior Publication Data
US 2020/0068704 A1   Feb. 27, 2020

(30) Foreign Application Priority Data
Aug. 23, 2018   (CN) .......................... 2018 1 0966030

(51) Int. Cl.
*H05K 1/02* (2006.01)
*G09G 3/32* (2016.01)

(52) U.S. Cl.
CPC ............. *H05K 1/0242* (2013.01); *G09G 3/32* (2013.01); *H05K 1/0251* (2013.01); *H05K 1/0298* (2013.01)

(58) Field of Classification Search
CPC ...... H05K 1/115; H05K 3/429; H05K 1/0251; H05K 2201/0187; H05K 2201/09536;
(Continued)

(56) References Cited

U.S. PATENT DOCUMENTS

2014/0182891 A1*  7/2014  Rengarajan ............ H05K 1/116
                                                                    174/251
2015/0211837 A1   7/2015  Mutnury et al.
(Continued)

FOREIGN PATENT DOCUMENTS

CN        2886982 Y     4/2007
CN      100512593 C     7/2009
(Continued)

OTHER PUBLICATIONS

First Office Action dated May 17, 2019 corresponding to Chinese application No. 201810966030.6.

*Primary Examiner* — Nelson M Rosario
(74) *Attorney, Agent, or Firm* — Nath, Goldberg & Meyer; Joshua B. Goldberg

(57) ABSTRACT

The present disclosure provides a printed circuit board including a plurality of conductive layers separated by insulating medium and a plurality of connection structures. Each connection structure penetrates each of the conductive layers. The plurality of conductive layers comprises a first conductive layer in which first signal lines are located and a second conductive layer in which second signal lines are located, and the first and second signal lines are connected via the connection structures. Anti-pads surrounding the connection structures are provided on others of the plurality of conductive layers except the first and the second conductive layers. For a same connection structure, the anti-pads surrounding the connection structure include adjacent anti-pads and nonadjacent anti-pads. Size of the adjacent anti-pads in any direction parallel to the conductive layers is smaller than that of the nonadjacent anti-pads. The present disclosure also provides a display apparatus.

20 Claims, 3 Drawing Sheets

(58) Field of Classification Search
CPC ... H05K 2201/09645; H05K 2203/061; H05K 2203/0713; H05K 3/4688; H05K 1/0242; H05K 1/0298; H05K 2201/0784; Y10T 29/49165; G09G 3/20; G09G 3/32
See application file for complete search history.

(56) References Cited

U.S. PATENT DOCUMENTS

| | | | |
|---|---|---|---|
| 2016/0374192 | A1 | 12/2016 | Morita et al. |
| 2018/0092222 | A1 | 3/2018 | Iketani et al. |
| 2020/0015364 | A1* | 1/2020 | Iketani .................. H05K 3/429 |

FOREIGN PATENT DOCUMENTS

| | | | |
|---|---|---|---|
| CN | 102811549 | A | 12/2012 |
| CN | 103179782 | A | 6/2013 |
| CN | 104394646 | A | 3/2015 |
| CN | 104838733 | A | 8/2015 |
| CN | 206118171 | U | 4/2017 |
| CN | 104041200 | B | 7/2017 |

* cited by examiner

PRINTED CIRCUIT BOARD AND DISPLAY APPARATUS

CROSS-REFERENCE TO RELATED APPLICATION

The present application claims the priority of the Chinese Patent Application with the Application No. 201810966030.6 filled Aug. 23, 2018, which is incorporated herein in the entire by reference.

TECHNICAL FIELD

The present disclosure relates to the field of electronic products, in particular to a printed circuit board and a display apparatus.

BACKGROUND

Printed Circuit Board (PCB) is a physical support for the electronic products, and is an important component for signal transmission. The signal (especially differential signal) transmission on a printed circuit board requires high impedance continuity of signal lines. On the printed circuit board, signal lines in different layers are connected via connection structures. In a case where there is other conductive layer between layers in which signal lines connected via a connection structure are located, a region of the conductive layer surrounding the connection structure is hollowed out, the hollowed out region is hereafter also referred to as an anti-pad for the connection structure. An impedance of the connection structure is typically much less than that of the signal lines.

SUMMARY

The present disclosure provides a printed circuit board, including a plurality of conductive layers separated by insulating medium and a plurality of connection structures. Each connection structure penetrates each of the conductive layers, the plurality of conductive layers includes a first conductive layer in which first signal lines are located and a second conductive layer in which second signal lines are located, the first conductive layer and the second conductive layer are different from each other, and the first signal lines and the second signal lines are connected via the connection structures. Anti-pads surrounding the connection structures are provided on others of the plurality of conductive layers except the first conductive layer and the second conductive layer. For a same connection structure, the anti-pads surrounding the connection structure include adjacent anti-pads and nonadjacent anti-pads. The adjacent anti-pads are anti-pads which are provided on a conductive layer adjacent to one of the first conductive layer and the second conductive layer, and the nonadjacent anti-pads are anti-pads that there is at least one conductive layer between the conductive layers on which the nonadjacent anti-pads are provided and both of the first conductive layer and the second conductive layer. Size of the adjacent anti-pads in any direction parallel to the conductive layers is smaller than that of the nonadjacent anti-pads.

In an embodiment of the present disclosure, at least one conductive layer is provided between the first conductive layer and the second conductive layer, and the at least one other conductive layer includes a ground layer.

In an embodiment of the present disclosure, the printed circuit board further includes a substrate on which the plurality of conductive layers are stacked. The nonadjacent anti-pads are provided at a side of the first conductive layer distal to the second conductive layer. In any two of the nonadjacent anti-pads, an orthographic projection of the nonadjacent anti-pad distal to the first conductive layer on the substrate covers that of the nonadjacent anti-pad proximal to the first conductive layer on the substrate and includes an exceeded portion beyond that of the nonadjacent anti-pad proximal to the first conductive layer on the substrate.

In an embodiment of the present disclosure, at a side of a same connection structure, a width of the exceeded portion is at least 2 mil.

In an embodiment of the present disclosure, the plurality of connection structures includes at least two connection structures for transmitting differential signals. Two connection structures used for transmitting a same group of differential signals form a connection structure group, and among the nonadjacent anti-pads surrounding a same connection structure group, the nonadjacent anti-pads located in a same conductive layer are formed integrally.

In an embodiment of the present disclosure, the connection structures are ring-shaped tubular structures.

In an embodiment of the present disclosure, the adjacent anti-pads surrounding the connection structures are ring-shaped.

In an embodiment of the present disclosure, the first signal lines and the second signal lines are connected with the connection structures via pads.

In an embodiment of the present disclosure, size of the pads in any direction parallel to the conductive layers is smaller than that of the adjacent anti-pads.

In an embodiment of the present disclosure, in any direction parallel to the conductive layers, a difference between the size of the pads and the size of the adjacent anti-pads is greater than or equal to 12 mil.

In an embodiment of the present disclosure, the pads and the adjacent anti-pads are concentric ring-shaped; and an inner diameter of the pads is equal to that of the adjacent anti-pads.

The present disclosure provides a display apparatus, including an array substrate and the printed circuit board of the present disclosure electrically connected with the array substrate.

In an embodiment of the present disclosure, the printed circuit board further includes a substrate on which the plurality of conductive layers are stacked. The nonadjacent anti-pads are provided at a side of the first conductive layer distal to the second conductive layer. In any two of the nonadjacent anti-pads, an orthographic projection of the nonadjacent anti-pad distal to the first conductive layer on the substrate covers that of the nonadjacent anti-pad proximal to the first conductive layer on the substrate and includes an exceeded portion beyond that of the nonadjacent anti-pad proximal to the first conductive layer on the substrate.

In an embodiment of the present disclosure, at a side of a same connection structure, a width of the exceeded portion is at least 2 mil.

In an embodiment of the present disclosure, the printed circuit board includes at least two connection structures for transmitting differential signals. Two connection structures used for transmitting a same group of differential signals form a connection structure group, and among the nonadjacent anti-pads surrounding a same connection structure group, the nonadjacent anti-pads located in a same conductive layer are formed integrally.

In an embodiment of the present disclosure, the connection structures are ring-shaped tubular structures.

In an embodiment of the present disclosure, the adjacent anti-pads surrounding the connection structures are ring-shaped.

In an embodiment of the present disclosure, the first signal lines and the second signal lines are connected with the connection structures via pads.

In an embodiment of the present disclosure, size of the pads in any direction parallel to the conductive layers is smaller than that of the adjacent anti-pads.

In an embodiment of the present disclosure, in any direction parallel to the conductive layers, a difference between the size of the pads and the size of the adjacent anti-pads is greater than or equal to 12 mil.

BRIEF DESCRIPTION OF DRAWINGS

Drawings used to provide a further understanding of the present disclosure are a part of the description and for explaining the present disclosure together with the detail description of embodiments without limiting the present disclosure, in the drawings.

DETAIL DESCRIPTION OF EMBODIMENTS

The detail description of embodiments will be described below in conjunction with the accompanying drawings. It should be understood that the detail description of embodiments described here is only used to illustrate and explain the present disclosure without limiting the present disclosure.

An impedances of a connection structure in a printed circuit boards is typically much less than that of signal lines, which results in discontinuous impedance for signal transmission, thereby causing a technical problem of signal reflection.

The present disclosure provides a printed circuit board and a display apparatus, such that impedance continuity in the circuit board can be improved. That is, the impedance continuity for signal transmission in the printed circuit boards can be improved.

Figure 1:
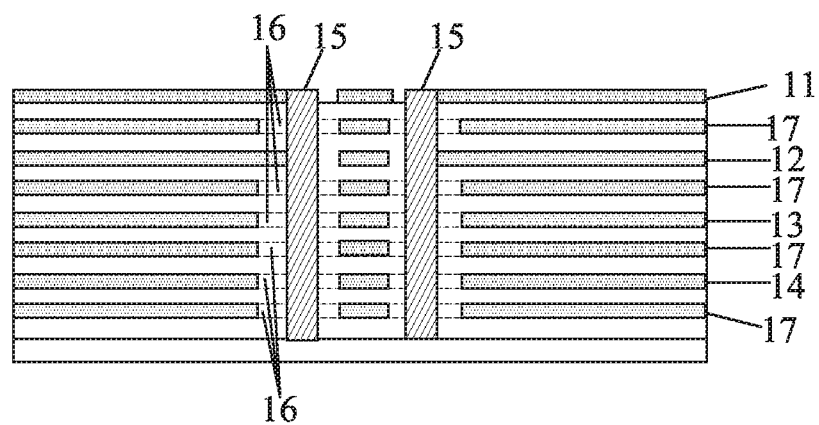
FIG. 1 is a structural schematic diagram of films of a printed circuit board.

FIG. 1 is a structural schematic diagram of films of a printed circuit board.

As shown in FIG. 1, a printed circuit board includes a plurality of signal line layers (a first signal line layer 11, a second signal line layer 12, a third signal line layer 13, and a fourth signal line layer 14 as shown in FIG. 1), and a ground layer 17 is provided between every two adjacent signal line layers to prevent signal interference. The signal line layers 11-14 and the ground layers 17 are separated by insulating medium. Two signal lines in the first signal line layer 11 are connected to two corresponding signal lines in the second signal line layer 12 via two connection structures 15, respectively. The signal lines connected via two connection structures 15 are used for transmitting differential signal. Anti-pads 16 for the connection structures 15 are provided on the third signal line layer 13, the fourth signal line layer 14 and each of the ground layers 17, that is, regions surrounding the connection structures 15 on the third signal line layer 13, the fourth signal line layer 14 and each of the ground layers 17 are hollowed out, and the hollowed out regions are the anti-pads 16.

High-speed differential signal transmission requires high impedance continuity, but the impedance of the connection structure 15 is much less, so the impedance continuity can be increased by increasing the impedance of the connection structure 15. As the connection structure 15 is capacitive (a capacitor is formed by the connection structure 15 and the surrounding conductive films separated by insulating medium), a larger size of the anti-pad 16 is, a larger impedance of the connection structure 15 is, thus the impedance of the connection structure 15 can be increased by increasing the size of the anti-pad 16. However, if sizes of all of the anti-pads 16 are increased, portions of each of the ground layers 17 corresponding to the anti-pad 16 may also be removed, such that portions of the signal lines corresponding to the anti-pads 16 lack reference planes, greatly increasing impedances of the portions of the signal lines corresponding to the anti-pads 16, thereby increasing the impedances of the signal lines while increasing the impedance of the connection structure. In this case, it is difficult to achieve impedance matching between the signal lines and the connection structure.

In order to achieve the impedance matching between the signal lines and the connection structure, the present disclosure provides a printed circuit board.

Figure 2:
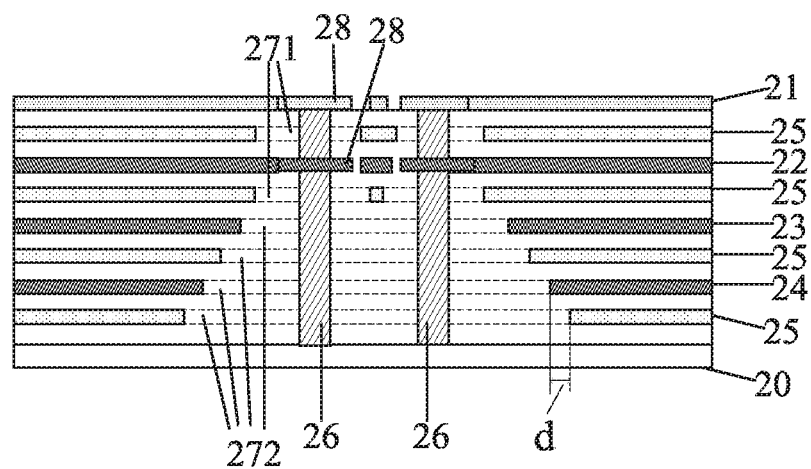
FIG. 2 is a structural schematic diagram of films of a printed circuit board according to an embodiment of the present disclosure.
Figure 3:
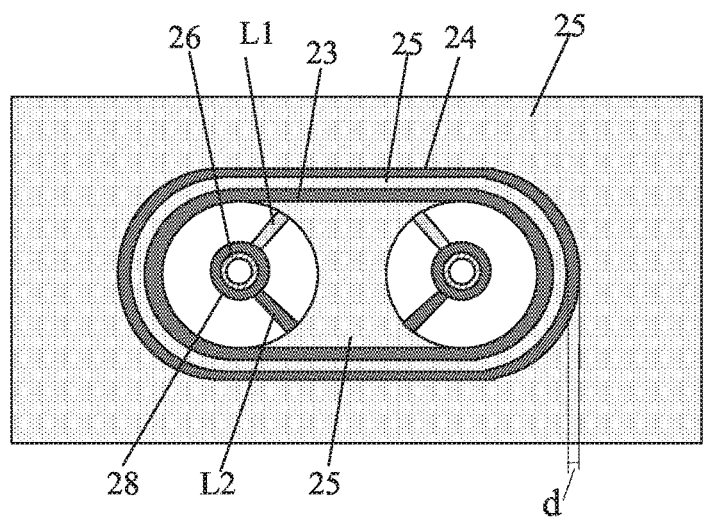
FIG. 3 is a bottom view of films on a substrate of the printed circuit board of FIG. 2.

FIG. 2 is a structural schematic diagram of films of a printed circuit board according to an embodiment of the present disclosure; FIG. 3 is a bottom view of films on a substrate of the printed circuit board of FIG. 2.

As shown in FIGS. 2 and 3, the printed circuit board includes a plurality of conductive layers 21-25 separated by insulating medium and a plurality of connection structures 26. The plurality of conductive layers 21-25 are stacked; and the insulating separation layers are provided between every adjacent two conductive layers. Each connection structure 26 penetrates each of the conductive layers 21-25. First signal lines L1 located in the first conductive layer 21 and second signal lines L2 located in the second conductive layer 22 are connected via the connection structures 26. Anti-pads surrounding the connection structures 26 are provided on the conductive layers 23-25.

For a same connection structure 26, the anti-pads surrounding the connection structure 26 include adjacent anti-pads 271 and nonadjacent anti-pads 272. The adjacent anti-pads 271 are anti-pads which are provided on a conductive layer adjacent to one of the first conductive layer in which the first signal lines L1 are located and the second conductive layer in which the second signal lines L2 are located, and the nonadjacent anti-pads 272 are anti-pads that there is at least one conductive layer between the conductive layers in which the nonadjacent anti-pads 272 are provide and both of the first and the second conductive layers. That is, there is no other conductive layer between the conductive layer in which the adjacent anti-pads 271 are provided and the first conductive layer or the second conductive layer, and there is at least one conductive layer between the conductive layer in which the nonadjacent anti-pads 272 are provided and the first conductive layer 21 and between the conductive layer in which the nonadjacent anti-pads 272 are provided and the second conductive layer 22. Size of the adjacent anti-pads 271 in any direction parallel to the conductive layers is smaller than that of the nonadjacent anti-pads 272.

The connection structure 26 is a conductor layer, formed by plating, formed on an inner wall of via penetrating each of the conductive layers and the insulating medium layers, and has tubular structure.

In an embodiment of the present disclosure, the connection structure 26 is a ring-shaped tubular structure. In an embodiment of the present disclosure, the adjacent anti-pad 271 surrounding the connection structure 26 is ring-shaped.

During an arrangement of each of anti-pads for the connection structure 26, size of the nonadjacent anti-pad 272 may be larger, to improve the impedance of the connection structure 26; while size of the adjacent anti-pad 271 may be smaller, such that size of portions of the first signal lines L1 and the second signal lines L2 corresponding to the adjacent anti-pad 271 is small, which results in the size of the portions of the first signal lines L1 and the second signal lines L2 lacking a reference plane to be small, to prevent the impedances of the first signal lines L1 and the second signal lines L2 from increasing, which facilitates to achieve the impedance matching between the connection structure 26 and the first signal lines L1 and the second signal lines L2, and facilitates to achieve the impedance continuity during transmitting signals, to reduce signal reflection due to the mismatch of impedances.

It should be understood that a plurality of the connection structures 26 are provided on the printed circuit board, and the above adjacent anti-pads 271 and nonadjacent anti-pads 272 are provided for one connection structure 26 as a reference. The first signal lines L1 or the second signal lines L2 connected with different connection structures 26 are not necessary to be located in a same conductive layer. Therefore, the adjacent anti-pads 271 for the different connection structures 26 are not necessary to be located in a same conductive layer, and the nonadjacent anti-pads 272 for the different connection structures 26 are not necessary to be located in a same conductive layer as well. In addition, it is noted that FIGS. 2 and 3 are only illustrative and do not limit the location of the layer in which the first signal lines L1 and the second signal lines L2 are located.

At least one other conductive layer is provided between the conductive layer 21 in which the first signal lines L1 are located and the conductive layer 22 in which the second signal lines L2 are located. And at least one conductive layer 25 between the conductive layer 21 in which the first signal lines L1 are located and the conductive layer 22 in which the second signal lines L2 are located may be a ground layer. In an embodiment of the present disclosure, some of the plurality of the conductive layers are signal line layers (the conductive layers 21-24 as shown in FIG. 2), others are ground layers (the plurality of the conductive layers 25 as shown in FIG. 2) provided between every two signal line layers, to prevent signal interference between adjacent signal line layers. The ground layers may be connected to each other via connectors (not shown) penetrating each of films.

As shown in FIG. 2, the printed circuit board further includes a substrate 20 on which the conductive layers 21-25 are provided. The plurality of the nonadjacent anti-pads 272 are provided at a side of the conductive layer 22 in which the second signal lines L2 are located distal to the conductive layer 21 in which the first signal lines L1 are located. In this case, as shown in FIGS. 2 and 3, in any two of the nonadjacent anti-pads 272, an orthographic projection of the nonadjacent anti-pad 272 distal to the conductive layer 22 on the substrate 20 covers and exceeds that of the nonadjacent anti-pad 272 proximal to the conductive layer 22. That is, at the side of the conductive layer 22 distal to the conductive layer 21, the further away from the conductive layer 22, the larger size of the nonadjacent anti-pad 272. In this way, during the design of the printed circuit boards, it is facilitated to achieve the impedance matching between the connection structure 26 and the first signal lines L1 and the second signal lines L2 by adjusting the size of each of the nonadjacent anti-pads 272.

Certainly, the plurality of the nonadjacent anti-pads 272 may be also provided at a side of the conductive layer 21 in which the first signal lines L1 are located distal to the conductive layer 22 in which the second signal lines L2 are located. In this case, in any two of the nonadjacent anti-pads 272, an orthographic projection of the nonadjacent anti-pad 272 distal to the conductive layer 21 on the substrate covers and exceeds that of the nonadjacent anti-pad 272 proximal to the conductive layer 21. That is, at the side of the conductive layer 21 distal to the conductive layer 22, the further away from the conductive layer 21, the larger size of the nonadjacent anti-pad 272, and vice versa.

In particular, when an orthographic projection of one of two nonadjacent anti-pads 272 on the substrate 20 covers and exceeds that of the other nonadjacent anti-pad 272, at a side of the same connection structure 26, a width d of the exceeded portion is at least 2 mil.

The printed circuit board of the present disclosure is especially adapted for transmitting differential signals. As shown in FIG. 2, at least two connection structures 26 are used for transmitting the differential signals. Two connection structures 26 used for transmitting a same group of differential signals form a connection structure group. Two first signal lines L1 connected with a same connection structure group are located in the same conductive layer 21, and two second signal lines L2 connected with a same connection structure group are located in the same conductive layer 22. In the nonadjacent anti-pads 272 surrounding the same group of two connection structures 26, the nonadjacent anti-pads 272 located in a same conductive layer are formed integrally. That is, regions of the conductive layers, which are not adjacent to the conductive layers in which the first signal lines L1 and the second signal lines L2, surrounding the two connection structures 26 are hollowed out, and the hollowed out regions surrounding the two connection structures 26 are connected. Two conductive layers being adjacent means that there is no other conductive layer between the two conductive layers.

In order to facilitate connecting the first signal lines L1 and the second signal lines L2 with the connection structures 26, as shown in FIGS. 2 and 3, pads 28 are also provided on the connection structures 26. The first signal lines L1 and the second signal lines L2 are connected with the connection structures 26 via the pads 28. A size of the pad 28 in any direction parallel to the conductive layers is smaller than that of the adjacent anti-pad 271. Specially, in any direction parallel to the conductive layers, a difference between the size of the pad 28 and the size of the adjacent anti-pad 271 is greater than or equal to 12 mil. More specially, the pad 28 and the adjacent anti-pad 271 are concentric ring-shaped. An inner diameter of the pad 28 is equal to that of the adjacent anti-pads 271. A difference between an outer diameter of the pad 28 and an outer diameter of the adjacent anti-pad 271 is 12 to 16 mil.

Figure 4:
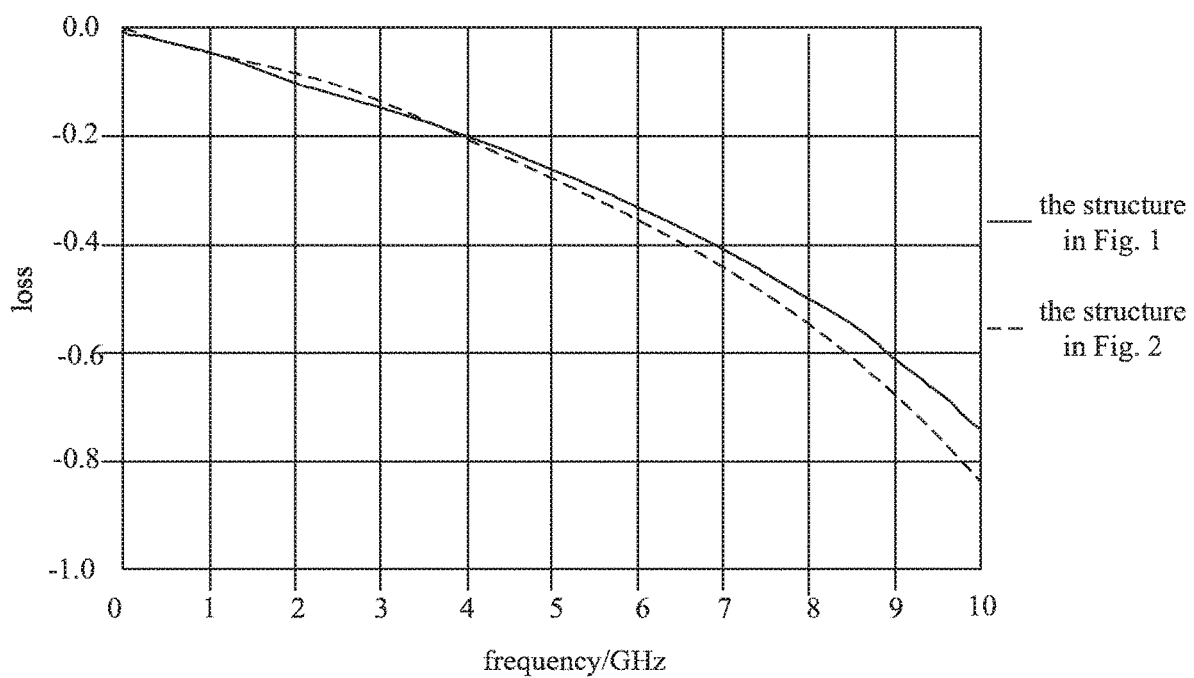
FIG. 4 is a comparison diagram of simulation for loss of signal transmission on the printed circuit boards of FIGS. 1 and 2.
Figure 5:
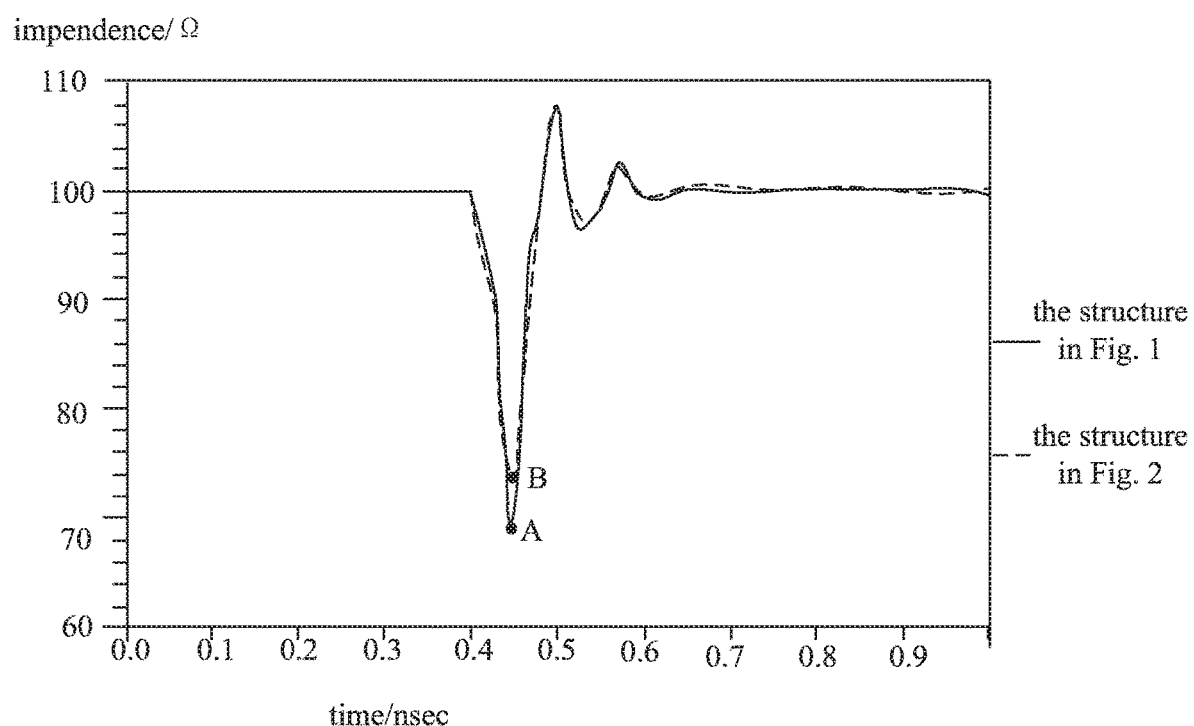
FIG. 5 is a comparison diagram of transmission impedances in the printed circuit boards of FIGS. 1 and 2.

FIG. 4 is a comparison diagram of simulation for loss of signal transmission on the printed circuit boards of FIGS. 1 and 2, and FIG. 5 is a comparison diagram of transmission impedances in the printed circuit boards of FIGS. 1 and 2. Time Domain Reflectometry (TDR) is used for measuring impedance of the transmission. The printed circuit boards of FIGS. 1 and 2 each include 8 conductive layers (4 signal line layers and 4 ground layers). The regions of the anti-pads are filled with composite materials (such as FR-4 materials) formed of epoxy resins with filling agents and glass fibers. In FIG. 1, the anti-pads have a same size, and are ring-shaped having an outer diameter of 28 mil and an inner diameter (that is, an outer diameter of the connection structure) of 10 mil. In FIG. 2, the adjacent anti-pads 271 are same size as the anti-pads in FIG. 1, two nonadjacent anti-pads 272 corresponding to a same connection structure group in a same layer are formed as an integrated structure having a shape of playground, that is, a structure constituted by two opposite semicircles and a middle rectangle. As shown in FIG. 3, a distance between centers of the two semicircles is 36 mil. In FIG. 2, in a direction from top to bottom, radii of 4 nonadjacent anti-pads 272 are 16 mil, 18 mil, 20 mil and 22 mil, respectively.

As show in FIG. 4, during transmitting low frequency signals, there is no significant difference between transmission losses in the structures in FIGS. 1 and 2, but if the frequency of the signals is greater than 4 GHz, the transmission loss in the structure in FIG. 1 is significantly greater than that in FIG. 2. And as the frequency is increasing, the difference between the transmission losses in the structures is more significant. As shown in FIG. 5, the minimum impedance (the impedance at the A point n FIG. 5) of the connection structure in FIG. 1 is 70.493Ω, and the minimum impedance (the impedance at the B point in FIG. 5) of the connection structures in FIG. 2 is 72.614Ω. It can be seen that the impedance of the connection structures of the present disclosure is significantly greater than that in FIG. 1, to achieve the impedance matching between the signal lines and the connection structure.

An embodiment of the present disclosure provides a display apparatus including an array substrate and a printed circuit board electrically connected with the array substrate. The printed circuit board is the printed circuit board provided by the above embodiments of the present disclosure. In an embodiment of the present disclosure, driver chips are provided on the printed circuit board which is used for providing driver signals of the driver chips to the array substrate.

The display apparatus may be an electronic paper, an OLED panel, a mobile phone, a tablet computer, a television, a display, a notebook computer, a digital photo frame, a navigator and any other products or components with a display function.

The printed circuit board provided by the present disclosure can achieve the match for impedances, increase the impedance consistency during transmitting signals and reduce the signal reflection due to impedance mismatch, therefore, the signals transmitted to the array substrate on the printed circuit board are more accurate, and the stability of the display apparatus is improved.

It should be understood that the above embodiments are merely exemplary embodiments used for illustrating the principle of the present disclosure, and the present disclosure is not limited thereto. Obviously, those skilled in the art can make various modifications and variants to this disclosure without departing from spirit and scope of this disclosure. As such, if these modifications and variants of this disclosure fall into the scope of the claims and their equivalents, the present disclosure intends to include these modifications and variants.

What is claimed is:

1. A printed circuit board, comprising a plurality of conductive layers separated by insulating medium and a plurality of connection structures, wherein each connection structure penetrates each of the conductive layers, the plurality of conductive layers comprises a first conductive layer in which first signal lines are located and a second conductive layer in which second signal lines are located, the first conductive layer and the second conductive layer are different from each other, and the first signal lines and the second signal lines are connected via the connection structures, anti-pads surrounding the connection structures are provided on others of the plurality of conductive layers except the first conductive layer and the second conductive layer, for a same connection structure, the anti-pads surrounding the connection structure comprise adjacent anti-pads and nonadjacent anti-pads, the adjacent anti-pads are anti-pads which are provided on a conductive layer adjacent to one of the first conductive layer and the second conductive layer, and the nonadjacent anti-pads are anti-pads that there is at least one conductive layer between the conductive layers on which the nonadjacent anti-pads are provided and both of the first conductive layer and the second conductive layer, and wherein size of the adjacent anti-pads in any direction parallel to the conductive layers is smaller than that of the nonadjacent anti-pads.

2. The printed circuit board of claim 1, wherein at least one conductive layer is provided between the first conductive layer and the second conductive layer, and the at least one other conductive layer comprises a ground layer.

3. The printed circuit board of claim 1, further comprising a substrate on which the plurality of conductive layers are stacked, the nonadjacent anti-pads are provided at a side of the first conductive layer distal to the second conductive layer, in any two of the nonadjacent anti-pads, an orthographic projection of the nonadjacent anti-pad distal to the first conductive layer on the substrate covers that of the nonadjacent anti-pad proximal to the first conductive layer on the substrate and comprises an exceeded portion beyond that of the nonadjacent anti-pad proximal to the first conductive layer on the substrate.

4. The printed circuit board of claim 3, wherein at a side of a same connection structure, a width of the exceeded portion is at least 2 mil.

5. The printed circuit board of claim 1, wherein the plurality of connection structures comprises at least two connection structures for transmitting differential signals, two connection structures used for transmitting a same group of differential signals form a connection structure group, and among the nonadjacent anti-pads surrounding a same connection structure group, the nonadjacent anti-pads located in a same conductive layer are formed integrally.

6. The printed circuit board of claim 1, wherein the connection structures are ring-shaped tubular structures.

7. The printed circuit board of claim 6, wherein the adjacent anti-pads surrounding the connection structures are ring-shaped.

8. The printed circuit board of claim. 1, wherein the first signal lines and the second signal lines are connected with the connection structures via pads.

9. The printed circuit board of claim 8, wherein size of the pads in any direction parallel to the conductive layers is smaller than that of the adjacent anti-pads.

10. The printed circuit board of claim 9, wherein in any direction parallel to the conductive layers, a difference between the size of the pads and the size of the adjacent anti-pads is greater than or equal to 12 mil.

11. The printed circuit board of claim 10, wherein the pads and the adjacent anti-pads are concentric ring-shaped; and an inner diameter of the pads is equal to that of the adjacent anti-pads.

12. A display apparatus, comprising an array substrate and the printed circuit board of claim 1 electrically connected with the array substrate.

13. The display apparatus of claim 12, wherein the printed circuit board further comprises a substrate on which the plurality of conductive layers are stacked,
the nonadjacent anti-pads are provided at a side of the first conductive layer distal to the second conductive layer;
in any two of the nonadjacent anti-pads, an orthographic projection of the nonadjacent anti-pad distal to the first conductive layer on the substrate covers that of the nonadjacent anti-pad proximal to the first conductive layer on the substrate and comprises an exceeded portion beyond that of the nonadjacent anti-pad proximal to the first conductive layer on the substrate.

14. The display apparatus of claim 13, wherein at a side of a same connection structure, a width of the exceeded portion is at least 2 mil.

15. The display apparatus of claim 12, wherein the printed circuit board comprises at least two connection structures for transmitting differential signals,
two connection structures used for transmitting a same group of differential signals form a connection structure group, and
among the nonadjacent anti-pads surrounding a same connection structure group, the nonadjacent anti-pads located in a same conductive layer are formed integrally.

16. The display apparatus of claim 12, wherein the connection structures are ring-shaped tubular structures.

17. The display apparatus of claim 16, wherein the adjacent anti-pads surrounding the connection structures are ring-shaped.

18. The display apparatus of claim 12, wherein the first signal lines and the second signal lines are connected with the connection structures via pads.

19. The display apparatus of claim 18, wherein size of the pads in any direction parallel to the conductive layers is smaller than that of the adjacent anti-pads.

20. The display apparatus of claim 19, wherein in any direction parallel to the conductive layers, a difference between the size of the pads and the size of the adjacent anti-pads is greater than or equal to 12 mil.

* * * * *